(12) United States Patent
Bonifield et al.

(10) Patent No.: US 6,967,349 B2
(45) Date of Patent: Nov. 22, 2005

(54) METHOD FOR FABRICATING A MULTI-LEVEL INTEGRATED CIRCUIT HAVING SCATTEROMETRY TEST STRUCTURES STACKED OVER SAME FOOTPRINT AREA

(75) Inventors: Thomas D. Bonifield, Dallas, TX (US); Vladimir A. Ukraintsev, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 234 days.

(21) Appl. No.: 10/251,498

(22) Filed: Sep. 20, 2002

(65) Prior Publication Data
US 2004/0058460 A1 Mar. 25, 2004

(51) Int. Cl.⁷ .............................................. H01L 29/04
(52) U.S. Cl. .............................. 257/48; 257/49; 257/53
(58) Field of Search .............................. 438/11, 18, 14, 438/15, 692; 257/48; 342/26, 59, 189, 192–195; 356/625, 369, 445

(56) References Cited

U.S. PATENT DOCUMENTS 6,556,652 B1 * 4/2003 Mazor et al. .................. 378/86
6,657,736 B1 * 12/2003 Finarov et al. .............. 356/625

* cited by examiner

Primary Examiner—Carl Whitehead, Jr.
Assistant Examiner—Yennhu B. Huynh
(74) Attorney, Agent, or Firm—W. James Brady, III; Frederick J. Telecky, Jr.

(57) ABSTRACT

The present invention describes a plurality of scatterometry test structures for use in process control during fabrication of a semiconductor wafer having multilevel integrated circuit chips, many of said levels having a feature size of a critical dimension. The scatterometry test structures on the wafer are at each level, suitable to measure critical dimensions. The second level and each subsequent level of the test structures are located to fit into the same footprint area as the first level.

4 Claims, 2 Drawing Sheets

METHOD FOR FABRICATING A MULTI-LEVEL INTEGRATED CIRCUIT HAVING SCATTEROMETRY TEST STRUCTURES STACKED OVER SAME FOOTPRINT AREA

FIELD OF THE INVENTION

The present invention is related in general to the field of electronic systems and semiconductor devices and more specifically to structures and methods used in controlling the critical dimensions in integrated circuit processing.

DESCRIPTION OF THE RELATED ART

Scatterometry has been defined as the measurement and characterization of light diffracted from periodic structures. The scattered or diffracted light pattern can be used to characterize the details of the grating shape itself. Principal features of scatterometry theory and application have recently been described by Ch. Raymond in the "Handbook of Silicon Semiconductor Metrology", pp. 477–513 (A. C. Diebold, Marcel Dekker Inc., New York, 2001). In the application of this metrology to silicon integrated circuit (IC) manufacture, scatterometry turns out to be simple and inexpensive, repeatable (good precision), and consistent with other methods (accurate).

In the so-called "forward step" of scatterometry, the diffracted light is measured using a scatterometer. When a test structure is used for this step, a relatively large area structure on the order of 50×50 $\mu m^2$ is needed. To accommodate such structure on a silicon wafer represents an economical problem, because silicon real estate is at a premium, given the relentless trends for shrinking IC feature sizes and maximizing the number of functional chips per wafer.

Using the scatter signature to determine the element of the periodic structure is often referred to as the "inverse step". This step involves the use of a (computerized) model, which defines the relationship between the scatter signatures and the shape of the features associated with those signatures. A number of models are in use; examples are given in FIGS. 1A and 1B by the geometry of the grating structure used by the so-called "Rigorous Coupled-Wave Theory" (RCWT, based on Maxwell's equations). On a substrate 101a in FIG. 1A, a structure of elements 103a is exposed to the incident laser light 104 from the incident region; under the elements 103a may or may not be one or several planar layers 102. The grating structure 103a consists of pluralities of identical vertical elements of rectangular shape (cross section). In FIG. 1B, a bottom antireflective coating layer 105 is on substrate 101b. The elements 103b in FIG. 1B have trapezoidal shape (cross section).

In theory, the accuracy of the RCWT model is excellent, and the nominal resolution is often better than 1%. However, the optical constants of the materials measured are not always invariable. Simple oxides such as SiO2 have well-known and consistent optical properties, but for poly-silicon, for example, the optical properties of the material may depend on the operating conditions of the deposition chamber. For empirical models, test structures for scatterometry have to be produced in periodic fashion; the measurements have to be compared with a library of data. The most common types of measurements are linewidth measurements in developed photoresist.

As mentioned, scatterometry test structures have to be relatively large (upwards of 50×50 $\mu m^2$). In silicon IC manufacture, measurements of a number of materials are needed, such as insulators, poly-silicon, metal, trenches etc. at several levels, and the number of needed test structures adds up quickly. It is an unresolved problem in known technology, where these structures should be positioned without sacrificing an unacceptable amount of silicon area. Furthermore, the test structures are usually remote from the electrical components which contain the materials and structures, which the scatterometry measurements define so that an unambiguous correlation between measured structure and electrical characteristic is often uncertain.

An urgent need has therefore arisen for a coherent, low-cost method of scatterometry test structure development and placement, compatible with silicon IC technology. The test structures should further provide excellent correlation with electrical component characteristics and high accuracy and precision. The fabrication method should be simple, yet flexible enough for different semiconductor product families and a wide spectrum of design and process variations. Preferably, these innovations should be accomplished with minimum dedicated silicon area, without extending production cycle time, and using the installed equipment, so that no investment in new manufacturing machines is needed.

SUMMARY OF THE INVENTION

The present invention describes a plurality of scatterometry test structures for use in process control during fabrication of a semiconductor wafer having multilevel integrated circuit chips, many of said levels having a feature size of a critical dimension. The scatterometry test structures on the wafer are at each level, suitable to measure critical dimensions. The second level and each subsequent level of the test structures are located to fit into the same footprint area as the first level.

This stacking of the test structures for the relatively large area structures (50×50 $\mu m^2$) saves precious silicon real estate.

Preferably, the locations of the stack of test structures are in the scribe street between the integrated circuit chips, but they may also be at selected sites across the wafer/chips so that quantitative measurements of process accuracy and precision can be made to fabricate critical dimensions.

It is a technical advantage of the present invention that the scatterometry test structures are fabricated concurrently with the integrated circuits of the chips so that no extra cost for their production is incurred.

It is another advantage of the invention that the scatterometry test structures can be located in close proximity to corresponding electrical test structures so that direct comparisons can be made between the desired electrical parameters and the critical geometrical dimensions necessary to generate them.

It is an aspect of the invention is that unpatterned metal layers may be used as shields between test structures at various levels, and that some of these shields may be electrically connected for use as probe pads.

Another aspect of the invention is that the number of scatterometry test structures across a wafer can be increased without requiring more silicon real estate. Among the candidate layers for critical dimensions and two-dimensional profiles by scatterometry using the advantages of the invention are Shallow trenches in substrate silicon;
gates;
poly-silicon lines;
contact holes in pre-metal dielectric;

metal lines;
trenches in inter-metal dielectrics;
via holes in inter-level dielectrics.

The technical advantages represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Scatterometry provides fast and precise measurements of critical dimensions, which are essential for achieving the desired electrical parameters of integrated circuit (IC) components, but this metrology requires relatively large test structures, such as 50×50 $\mu$m² or 64×64 $\mu$m². To accommodate a multitude of these structures in scribe streets or in IC chips areas, means to squander valuable silicon real estate.

Figure 1A:
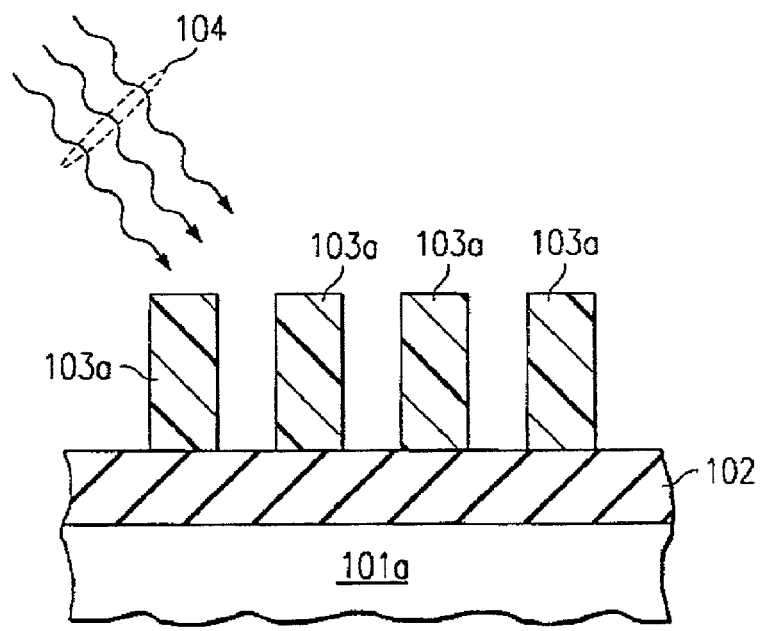
FIG. 1A is a schematic cross section of the grating stack used in scatterometry measurements based on rigorous coupled-wave theory (RCWT).
Figure 1B:
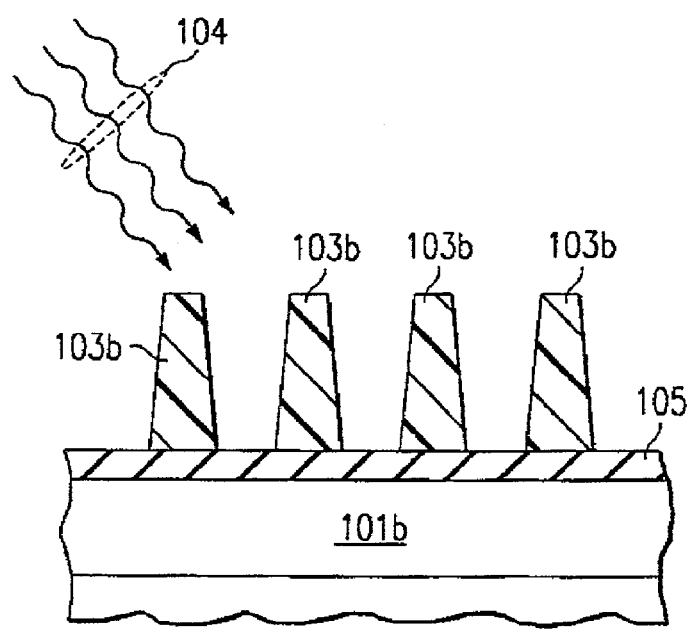
FIG. 1B is a schematic cross section of an example of a scatterometry structure comprising a patterned resist grating, beneath which is a bottom antireflex coating (BARC).
Figure 2:
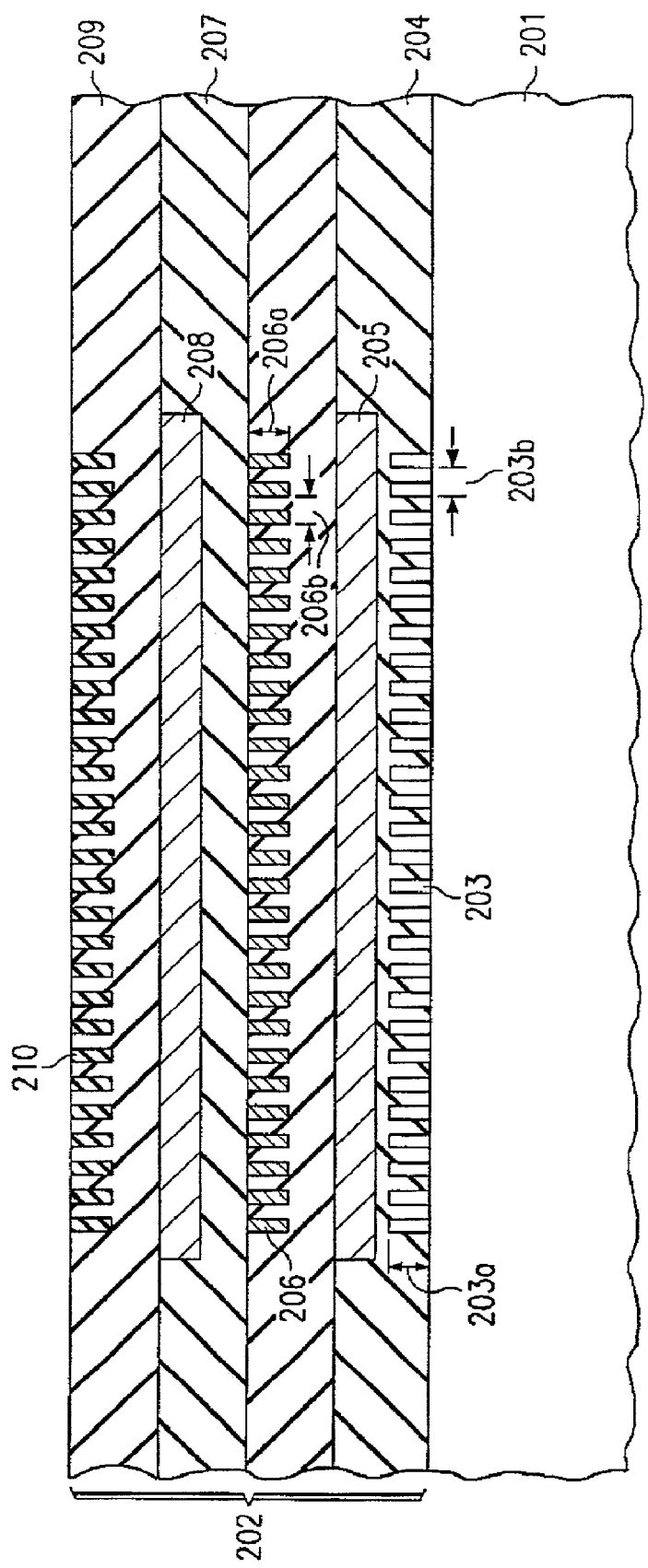
FIG. 2 is a schematic cross section of multiple sequential scatterometry test structures located as a stack over the same footprint area to illustrate the optimum utilization of area according to the invention.

FIG. 2 illustrates schematically the solution disclosed by the present invention. On a silicon substrate 201 is a plurality 202 of scatterometry test structures for use in process control during fabrication of a semiconductor wafer. The wafer has multilevel IC chips, and multilevel scatterometry test structures processed concurrently with the IC chips. Many of these levels have a feature size of a critical dimension and, therefore, need to be controlled with the scatterometry measurements.

In FIG. 2, the first scatterometry test structure 203 is intended for the poly-silicon layer of thickness 203a directly on top of the silicon substrate 201. In the example of FIG. 2, this scatterometry test structure has rectangular cross section of a pitch 203b, which allows the measurement of critical poly-silicon dimensions. After the scatterometry measurements have been completed, the test structure is embedded in insulator material 204. In order to insure that test structure 203 does not interfere with the measurements on subsequent test structures, structure 203 is shielded by metal layer 205, which, in the example of FIG. 2, is the first level metal and has to remain unpatterned over the area of test structure 203.

If shield 205 is electrically connected to other structures or components, it can serve as a probe pad for these structures. This implies that it can be contacted by outside probe needles (such as fine-tip tungsten needles) for electrical measurements.

The second metal level (thickness 206a) in FIG. 2 is patterned as the metal scatterometry test structure 206 (pitch 206b). It allows the measurement of critical metal dimensions. After the measurements are completed, insulator layer 207 is deposited, and, embedded in this insulator, the third metal layer 208. This metal layer is again intended to act as a shield for test structures 206, and consequently has to stay unpatterned.

If shield 208 is electrically connected to other structures or components, it can serve as a probe pad for these structures.

After depositing insulator material 209, grooves are etched to create trench scatterometry test structure 210. In FIG. 2, it is the last test structure shown, but in actual IC manufacturing, the creation of test structures can be repeated for all the IC levels. Today, six levels of metal are already common, and several IC products require eight metal levels, or more.

Among the critical dimensions and candidate layers for characterization by scatterometry are:
Shallow trenches in substrate silicon;
gates;
poly-silicon lines;
contact holes in pre-metal dielectric;
metal lines;
trenches in inter-metal dielectrics;
via holes in inter-level dielectrics.

According to the invention, the scatterometry test structures are fabricated concurrently with the respective level of the IC. The second level and each subsequent level of the test structures fit into the same footprint area as the first level, and thus form a stack of test structures over the same footprint area, similar to the three level of test structures shown in FIG. 2.

Preferably, the locations of the test structure stacks are in the scribe streets of a semiconductor wafer. But it is a technical advantage of the invention that the stacks can be placed in any location across a wafer and across the chips. In this fashion, profiles of critical dimensions across chip areas and whole wafer areas can be monitored in order to ensure both accuracy and precision of these critical dimensions.

Another technical advantage of the invention is the fact that the scatterometry test structures, as exemplified in FIG. 2, can be placed under probe pad in close proximity to corresponding electrical test structures. In particular, scatterometry test structures can be placed underneath already existing electrical probe pads of electrical test structures. With this concept, the invention offers an effective tool to monitor and control the correlation between critical dimensions and the electrical parameters of components essential for the IC.

It is another technical advantage of the invention to provide scatterometry measurements on photoresist layers on top of uniform substrate layers and then compare these data with scatterometry measurements collected from other material layers. Examples of such uniform layers in FIG. 2 are the layers designated 205, 208 and 209.

The method for fabricating a multi-level IC having multiple sequential scatterometry test structures comprises the following steps, which can be best outlined in conjunction with FIG. 2:
providing a semiconductor wafer 201 prepared for patterning the first material layer;
patterning the first material layer 203 for the IC and, at selected sites, concurrently patterning for the first of the scatterometry test structures 203;
analyzing the first scatterometry structures;
depositing the next layer, comprising metal 205, and leaving it unpatterned over the first test structure to shield this structure;

depositing a second material layer 206 over the wafer and preparing it for patterning;

patterning the second material layer 206 for the IC and concurrently patterning the second of the test structures 206, positioned in the same locations as the first test structures 203, thereby forming a stack of test structures over the same footprint area; and analyzing the second scatterometry test structures 206.

This sequence of process steps can be continued by depositing the next metal layer 208 and leaving it unpatterned over the second test structure 206 to shield this structure; and repeating the sequence of steps of
  depositing a material layer (210),
    patterning this layer for the IC and concurrently patterning a fresh scatterometry test structure stacked over the same footprint area, and
    analyzing the fresh structure (210), until all levels of the IC are fabricated.

Each material layer used on this sequence of process steps is selected from a group consisting of poly-silicon, silicon germanium, gallium arsenide, other semiconductors, ferroelectric materials, a plurality of metals including aluminum, copper, titanium, tungsten, other refractory metals, a plurality of insulators including silicon dioxide, silicon nitride, and a plurality of polymer materials including polyimide and photoresist.

The selected sites for the scatterometry test structures may be located in scribe streets and/or IC locations. In either case, the structures are preferably located in proximity to corresponding electrical test structures. Furthermore, the electrical shield layer can be electrically connected to serve as probe pads for test needles.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for fabricating a multi-level integrated circuit having multiple sequential scatterometry test structures, comprising the steps of:

providing a semiconductor wafer prepared for patterning the first material layer;

patterning said first material layer for said integrated circuit and, at selected sites, concurrently patterning the first of said test structures;

analyzing said first scatterometry structures;

depositing the next layer, comprising metal, and leaving it unpatterned over said first test structure to shield said structure;

depositing a second material layer over said wafer and preparing it for patterning;

patterning said second material layer for said integrated circuit and concurrently patterning the second-of said test structures, positioned in the same locations as the first test structures, thereby forming a stack of test structures over the same footprint area; and analyzing said second scatterometry test structures.

2. The method according to claim 1 further comprising the steps of:

depositing the next metal layer and leaving it unpatterned over said second test structure to shield said structure; and repeating the step sequence of
  depositing a material layer,
    patterning said layer for said integrated circuit and concurrently patterning a fresh scatterometry test structure stacked over the same footprint area, and
    analyzing said fresh test structure, until all levels of said integrated circuit are fabricated.

3. The method according to claim 1 wherein said material layer is selected from a group consisting of poly-silicon, silicon germanium, gallium arsenide, other semiconductors, ferroelectric materials, a plurality of metals including aluminum, copper, titanium, tungsten, other refractory metals, a plurality of insulators including silicon dioxide, silicon nitride, other insulators, and a plurality of polymer materials including polyimide and photoresist.

4. The method according to claim 1 wherein said selected sites for said scatterometry test structures may be located in scribe streets and/or in integrated circuit locations.

* * * * *